US009569582B2

(12) United States Patent
Arbel et al.

(10) Patent No.: US 9,569,582 B2
(45) Date of Patent: Feb. 14, 2017

(54) TEMPLATE MATCHING FOR RESILIENCE AND SECURITY CHARACTERISTICS OF SUB-COMPONENT CHIP DESIGNS

(71) Applicant: International Business Machines Corporation, Armonk, NY (US)

(72) Inventors: Eli Arbel, Haifa (IL); Pradip Bose, Yorktown Heights, NY (US); Prabhakar Kudva, New York, NY (US); Shiri Moran, Kiryat Tivon (IL); K. Paul Muller, Wappinger Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 526 days.

(21) Appl. No.: 14/146,770

(22) Filed: Jan. 3, 2014

(65) Prior Publication Data
US 2016/0154921 A1 Jun. 2, 2016

(51) Int. Cl.
*G06F 17/50* (2006.01)

(52) U.S. Cl.
CPC ................ *G06F 17/5081* (2013.01)

(58) Field of Classification Search
CPC ...... G06F 19/22; G06F 17/5081; G06F 19/24; G06F 17/504; G06F 17/5072; G06F 19/28; G06F 11/10; G06F 17/505; G06F 17/5031; G06F 17/5036; G06F 17/5054; G06F 2217/70; G06F 21/566; G06F 21/567; G06F 21/554; G06F 2221/033
(Continued)

(56) References Cited

U.S. PATENT DOCUMENTS

| 6,003,151 A | 12/1999 | Chuang |
| 6,532,440 B1 | 3/2003 | Boppana et al. |
| 6,817,006 B1 | 11/2004 | Wells et al. |
| 7,096,440 B2 | 8/2006 | Fechser |
| 7,890,901 B2 | 2/2011 | Gemmeke et al. |

(Continued)

FOREIGN PATENT DOCUMENTS

| CN | 102054100 A | 5/2011 |
| EP | 1 160 987 B1 | 2/2006 |

OTHER PUBLICATIONS

"ARM Security Technology", Building a Secure System using TrustZone Technology, ARN Limited, whitepaper, http://infocenter.arm.com/help/topic/com.arm.doc.prd29-genc-009492c/PRD29-GENC-009492C_trustzone_security_whitepaper.pdf, 2005-2009, 108 pages.

(Continued)

*Primary Examiner* — Binh Tat
(74) *Attorney, Agent, or Firm* — Francis Lammes; Stephen J. Walder, Jr.; Jennifer R. Davis

(57) ABSTRACT

A mechanism is provided for validating overall resilience and security characteristics of a sub-component chip design. For each instance of a resiliency template identified as appearing in a design netlist of the sub-component chip design thereby forming one or more identified resiliency sections, a determination is made as to whether an output of the design netlist where an error signal is output interconnects to the one or more identified resiliency sections of the design netlist. Responsive to the one or more identified resiliency sections interconnecting to the output of the design netlist where the error signal is output, one or more identified resiliency sections are marked as being protected by the error signal. An identification of the one or more identified resiliency sections and an identification of the error signal protecting the one or more identified resiliency sections are output to a design team.

20 Claims, 2 Drawing Sheets

(58) Field of Classification Search
USPC .................................................. 716/100–109
See application file for complete search history.

(56) References Cited

U.S. PATENT DOCUMENTS

| | | | |
|---|---|---|---|
| 8,056,037 B2 | 11/2011 | Koehl et al. | |
| 8,589,841 B2 | 11/2013 | Arbel et al. | |
| 2004/0015788 A1* | 1/2004 | Huang | G01R 31/31836 716/103 |
| 2010/0097107 A1 | 4/2010 | Dartu et al. | |
| 2011/0113392 A1* | 5/2011 | Chakraborty | G06F 17/505 716/102 |
| 2013/0326441 A1* | 12/2013 | Ward | G06F 17/504 716/103 |

OTHER PUBLICATIONS

"Error Localization Using Source Control and Logic Semantics for VHDL/Verilog designs", www.ip.com, Disclosed Anonymously, IPCOM000216951D, Apr. 25, 2012, 4 pages.

"Method and System for the Automated Minimization of EDA Software Testcases", www.ip.com, Disclosed Anonymously, IPCOM000212618D, Nov. 18, 2011, 10 pages.

Beaumont, Mark et al., "Hardware Trojans—Prevention, Detection, Countermeasures", A Literature Review, Unclassified, Australian Government Department of Defense, http://rijndael.ece.vt.edu/sha3/citationsBib/pub/C05ref03C10ref11_HardwareTrojans.pdf, 2011, 50 pages.

Chakraborty, Rajat S. et al., "Hardware Trojan: Threats and Emerging Solutions", IEEE, Invited Paper, High Level Design Validation and Test Workshop (HLDVT), San Francisco, California, 2009, pp. 166-171.

Jin, Yier et al., "Hardware Trojan Detection Using Path Delay Fingerprint", Proceedings of the 2008 IEEE International Workshop on Hardware-Oriented Security and Trust, 2008, pp. 51-57.

Stok, Leon et al., "Wavefront Technology Mapping", Proceedings of the conference on Design, Automation and Test in Europe (Date'99), Article No. 108, 1999, 6 pages.

* cited by examiner

TEMPLATE MATCHING FOR RESILIENCE AND SECURITY CHARACTERISTICS OF SUB-COMPONENT CHIP DESIGNS

GOVERNMENT RIGHTS

This invention was made with Government support under DARPA, HR-0011-13-C-0022. THE GOVERNMENT HAS CERTAIN RIGHTS IN THIS INVENTION.

BACKGROUND

The present application relates generally to an improved data processing apparatus and method and more specifically to mechanisms for template matching for resilience and security characteristics of sub-components chips designs as well as proprietary design implementation used within the sub-component chip designs.

With current scaling of chip designs, an increase in an amount of proprietary design implementation that will be used within systems in such chip designs is expected. Such proprietary design implementation may be designed in-house; however, there is some expectation that some sub-component designs may come from outside sources, such as external suppliers, outsourced design houses, original equipment manufacturer (OEM) suppliers, or the like.

SUMMARY

In one illustrative embodiment, a method, in a data processing system, is provided for validating an overall resilience and security characteristics of a sub-component chip design. The illustrative embodiment determining whether an output of the design netlist where an error signal is output interconnects to one or more identified resiliency sections of the design netlist for each instance of a resiliency template identified as appearing in a design netlist of the sub-component chip design thereby forming one or more identified resiliency sections of the design netlist. The illustrative embodiment marks the one or more identified resiliency sections of the design netlist as being protected by the error signal in response to the one or more identified resiliency sections of the design netlist interconnecting to the output of the design netlist where the error signal is output. The illustrative embodiment outputs an identification of the one or more identified resiliency sections of the design netlist and an identification of the error signal protecting the one or more identified resiliency sections of the design netlist to a design team of a larger chip design where the sub-component chip design is to be integrated.

In other illustrative embodiments, a computer program product comprising a computer useable or readable medium having a computer readable program is provided. The computer readable program, when executed on a computing device, causes the computing device to perform various ones of, and combinations of, the operations outlined above with regard to the method illustrative embodiment.

In yet another illustrative embodiment, a system/apparatus is provided. The system/apparatus may comprise one or more processors and a memory coupled to the one or more processors. The memory may comprise instructions which, when executed by the one or more processors, cause the one or more processors to perform various ones of, and combinations of, the operations outlined above with regard to the method illustrative embodiment.

These and other features and advantages of the present invention will be described in, or will become apparent to those of ordinary skill in the art in view of, the following detailed description of the example embodiments of the present invention.

BRIEF DESCRIPTION OF THE SEVERAL VIEWS OF THE DRAWINGS

The invention, as well as a preferred mode of use and further objectives and advantages thereof, will best be understood by reference to the following detailed description of illustrative embodiments when read in conjunction with the accompanying drawings, wherein.

DETAILED DESCRIPTION

The reliability and security specifications of sub-component designs coming from outside sources to be integrated into larger chip designs need to be independently evaluated and verified by design teams responsible for integrating such sub-component designs. However, these outside sources may provide limited data about functionality of these sub-component designs in order to protect their proprietary design implementation. In other cases, even when full information is provided, there is still a necessity to evaluate the characteristics described in order to protect against errors in analysis/design of the proprietary design implementation for the characteristics, lack of understanding of requirements, negligence, human error, or malicious acts. The illustrative embodiments provide for validation of the overall resilience and security characteristics sub-component chip designs, in particular, those where the detailed functionality is not fully known where only a netlist is available to be integrated into a larger chip design, is problematic. Prior solutions are purely based on rule of thumb estimation approaches or paper assessments.

Figure 1:
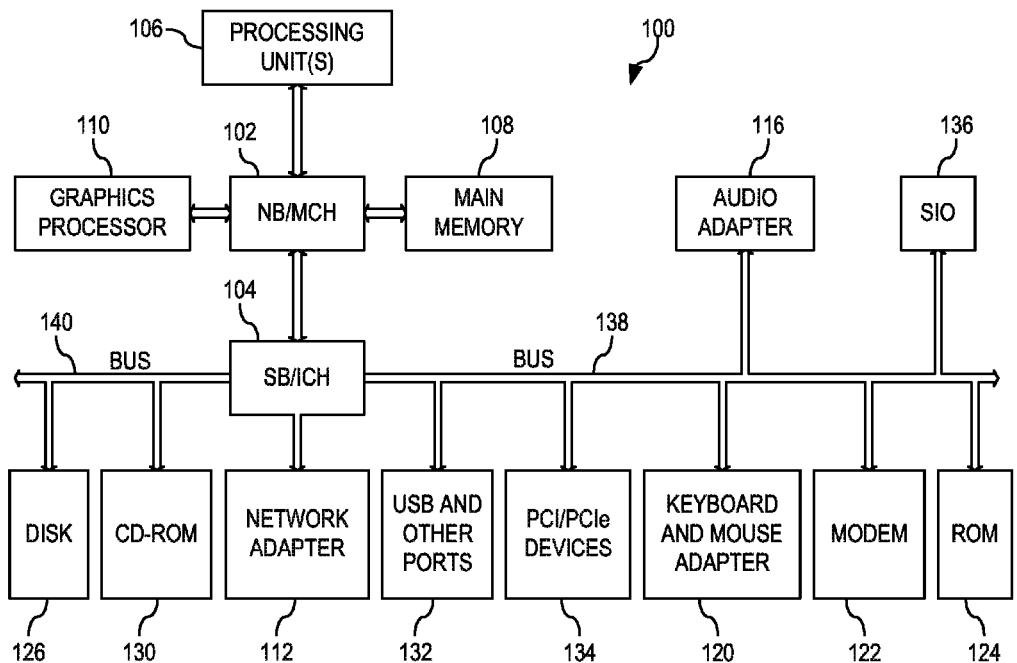
FIG. 1 is an example block diagram of a computing device in which aspects of the illustrative embodiments may be implemented.

Thus, the illustrative embodiments may be utilized in many different types of data processing environments. In order to provide a context for the description of the specific elements and functionality of the illustrative embodiments, FIG. 1 is provided hereafter as an example environment in which aspects of the illustrative embodiments may be implemented. It should be appreciated that FIG. 1 is only an example and is not intended to assert or imply any limitation with regard to the environments in which aspects or embodiments of the present invention may be implemented. Many modifications to the depicted environments may be made without departing from the spirit and scope of the present invention.

FIG. 1 is a block diagram of an example data processing system in which aspects of the illustrative embodiments may be implemented. Data processing system 100 is an example of a computer in which computer usable code or instructions implementing the processes for illustrative embodiments of the present invention may be located.

In the depicted example, data processing system 100 employs a hub architecture including north bridge and memory controller hub (NB/MCH) 102 and south bridge and input/output (I/O) controller hub (SB/ICH) 104. Processing unit 106, main memory 108, and graphics processor 110 are connected to NB/MCH 102. Graphics processor 110 may be connected to NB/MCH 102 through an accelerated graphics port (AGP).

In the depicted example, local area network (LAN) adapter 112 connects to SB/ICH 104. Audio adapter 116, keyboard and mouse adapter 120, modem 122, read only memory (ROM) 124, hard disk drive (HDD) 126, CD-ROM drive 130, universal serial bus (USB) ports and other communication ports 132, and PCI/PCIe devices 134 connect to SB/ICH 104 through bus 138 and bus 140. PCI/PCIe devices may include, for example, Ethernet adapters, add-in cards, and PC cards for notebook computers. PCI uses a card bus controller, while PCIe does not. ROM 124 may be, for example, a flash basic input/output system (BIOS).

HDD 126 and CD-ROM drive 130 connect to SB/ICH 104 through bus 140. HDD 126 and CD-ROM drive 130 may use, for example, an integrated drive electronics (IDE) or serial advanced technology attachment (SATA) interface. Super I/O (SIO) device 136 may be connected to SB/ICH 104.

An operating system runs on processing unit 106. The operating system coordinates and provides control of various components within the data processing system 100 in FIG. 1. As a client, the operating system may be a commercially available operating system such as Microsoft Windows 7®. An object-oriented programming system, such as the Java™ programming system, may run in conjunction with the operating system and provides calls to the operating system from Java™ programs or applications executing on data processing system 100.

As a server, data processing system 100 may be, for example, an IBM® eServer™ System P® computer system, running the Advanced Interactive Executive (AIX®) operating system or the LINUX® operating system. Data processing system 100 may be a symmetric multiprocessor (SMP) system including a plurality of processors in processing unit 106. Alternatively, a single processor system may be employed.

Instructions for the operating system, the object-oriented programming system, and applications or programs are located on storage devices, such as HDD 126, and may be loaded into main memory 108 for execution by processing unit 106. The processes for illustrative embodiments of the present invention may be performed by processing unit 106 using computer usable program code, which may be located in a memory such as, for example, main memory 108, ROM 124, or in one or more peripheral devices 126 and 130, for example.

A bus system, such as bus 138 or bus 140 as shown in FIG. 1, may be comprised of one or more buses. Of course, the bus system may be implemented using any type of communication fabric or architecture that provides for a transfer of data between different components or devices attached to the fabric or architecture. A communication unit, such as modem 122 or network adapter 112 of FIG. 1, may include one or more devices used to transmit and receive data. A memory may be, for example, main memory 108, ROM 124, or a cache such as found in NB/MCH 102 in FIG. 1.

Those of ordinary skill in the art will appreciate that the hardware in FIG. 1 may vary depending on the implementation. Other internal hardware or peripheral devices, such as flash memory, equivalent non-volatile memory, or optical disk drives and the like, may be used in addition to or in place of the hardware depicted in FIG. 1. Also, the processes of the illustrative embodiments may be applied to a multiprocessor data processing system, other than the SMP system mentioned previously, without departing from the spirit and scope of the present invention.

Moreover, the data processing system 100 may take the form of any of a number of different data processing systems including client computing devices, server computing devices, a tablet computer, laptop computer, telephone or other communication device, a personal digital assistant (PDA), or the like. In some illustrative examples, data processing system 100 may be a portable computing device that is configured with flash memory to provide non-volatile memory for storing operating system files and/or user-generated data, for example. Essentially, data processing system 100 may be any known or later developed data processing system without architectural limitation.

Again, the illustrative embodiments provide for validation of the overall resilience and security characteristics sub-component chip designs, in particular, those where the detailed functionality is not fully known where only a netlist is available to be integrated into a larger chip design, is problematic. The illustrative embodiments search for and identify the existence on the sub-component chip design of one or more among a collection of resiliency templates and security templates. Further, once one or more resiliency templates are identified, the illustrative embodiments identify how the existence of such resiliency templates relates to characteristics of the chip such as: error recovery, general resilience, cryptography, security, or the like.

Figure 2:
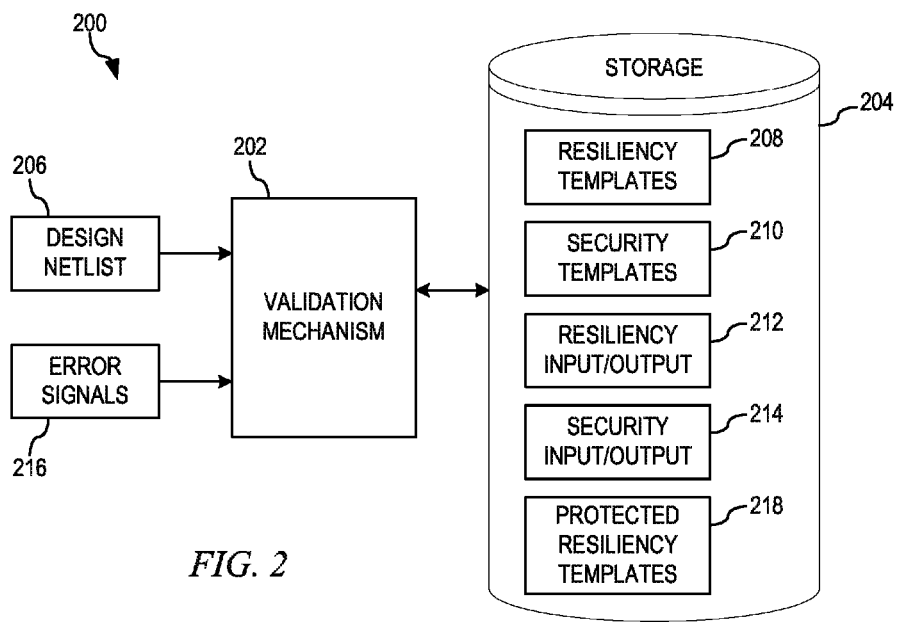
FIG. 2 depicts a validation mechanism for validating overall resilience and security characteristics of sub-component chip designs in accordance with an illustrative embodiment.

FIG. 2 depicts a validation mechanism for validating overall resilience and security characteristics of sub-component chip designs in accordance with an illustrative embodiment. Data processing system 200 comprises validation mechanism 202 and storage 204. Validation mechanism 202 receives, at a bare minimum, design netlist 206 of a sub-component chip design from an outside source, such as an external supplier, outsourced design house, original equipment manufacturer (OEM) supplier, or the like. Design netlist 206 provided by the outside source describes the connectivity of an electronic design of the sub-component in order for the sub-component to be integrated into a larger chip design by a system design team. While design netlist 206 is the bare minimum of information required by validation mechanism 202, if the outside vendor provides additional information up to a full functional description, validation mechanism 202 utilizes all provided information in validation of the sub-component chip design.

In order to evaluate and verify that proprietary design implementation of the sub-component chip design indeed meets the requirements of the system design team of the larger chip design, validation mechanism 202 identifies one or more resiliency templates from resiliency templates 208 in storage 204 as well as one or more security templates from security templates 210 also in storage 204. In accordance with the illustrative embodiments, resilience is the ability to detect transient or permanent errors in hardware of a chip design. For example, errors caused due to cosmic radiation, permanent chip failures, electromigration, or the like. Thus, each of resiliency templates 208 is a known circuit design pattern used to check for transient or permanent errors in a chip design. Additionally, in accordance with the illustrative embodiments, security is the ability to detect Trojan logic in a chip design with malicious intent, which is not part of the chip design specification. Thus, each of security templates 210 is a known circuit design pattern used to check for malicious hardware in a chip design.

Each template in resiliency templates 208 and security templates 210 is a library of known structures which may be interconnections of patterns (such as a network of parity trees, a network of syndrome calculators), a known firmware block or hardware/firmware blocks (hardware that triggers certain known firmware patterns), or certain configuration bits of test structures and matching patterns, configuration bits in processor with patterns of hardware, or the like.

For each template in resiliency templates 208 and security templates 210, validation mechanism 202 determines whether that exact template appears in design netlist 206. That is, validation mechanism 202 determines whether the exact configuration, interconnection, or the like, of electronic components in the selected template appears in one or more locations within design netlist 206. Each time validation mechanism 202 identifies a section of design netlist 206 that matches a resiliency template from resiliency templates 208 forming one or more identified resiliency sections of design netlist 206, validation mechanism 202 records the inputs that feed the section of design netlist 206 matching the resiliency template as well as the outputs coming out of the section of design netlist 206 matching the resiliency template in resiliency input/output data structure 212 along with a record of the resiliency template that was matched. Similarly, each time validation mechanism 202 identifies a section of design netlist 206 that matches a security template from security templates 210 forming one or more identified security sections of design netlist 206, validation mechanism 202 records the inputs that feed the section of design netlist 206 matching the security template as well as the outputs coming out of the section of design netlist 206 matching the security template in security input/output data structure 214 along with a record of the security template that was matched.

Once validation mechanism 202 has determined whether each template in resiliency templates 208 and security templates 210 appears in design netlist 206 and recorded those instances where particular resiliency template(s) and security template(s) appear as well the associated input and outputs associated with the identified occurrences, validation mechanism 202 outputs those sections of design netlist 206 where instances of security templates 210 are identified along with their associated inputs/outputs recorded in security input/output data structure 214 to the system design team of the larger chip.

For those sections of design netlist 206 where instances of resiliency templates are identified along with their associated inputs/outputs recorded in resiliency input/output data structure 212, validation mechanism 202 utilizes a set of error signals 216 provided by the outside source of design netlist 206 to identify which sections of design netlist 206 where instances of the resiliency templates are identified in resiliency input/output data structure 212 are protected by one or more error signals in the set of error signals 216. Each error signal in the set of error signals 216 identifies one or more outputs where the error signal would be emitted from design netlist 206, i.e. one or more output location in design netlist 206 of the sub-component where, if an error were to occur in the operation of the sub-component, the error signal would appear to be transmitted to another component of the larger chip. Further, each error signal in the set of error signals 216 may be an error signal such as parity, error-correcting code, syndrome calculation, state checking, orthogonality, state bit checking, residue checking, or the like.

For each error signal in the set of error signals 216, validation mechanism 202 utilizes the one or more associated outputs of the error signal to perform a breadth-first search (BFS) each latch within design netlist 206 to detect whether the signal emanates from one or more of sections of design netlist 206 where the resiliency templates are identified in resiliency input/output data structure 212. That is, validation mechanism 202 searches backwards from an output where the error signal is indicated to be output from the design netlist 206 to determine whether one or more outputs associated with the one or more sections of design netlist 206 where the resiliency templates are identified in resiliency input/output data structure 212 are interconnected to at least one output associated with the error signal. If validation mechanism 202 determines that one or more outputs associated with the one or more sections of design netlist 206 where the resiliency templates are identified in resiliency input/output data structure 212 are interconnected to at least one output associated with the error signal, validation mechanism 202 marks the section of design netlist 206 where the resiliency template is identified as being protected by the error signal. Each time validation mechanism 202 identifies a section of design netlist 206 where resiliency template is identified in resiliency input/output data structure 212 as being protected by an error signal, validation mechanism 202 records the section of design netlist 206 where the resiliency template is identified as being protected and the error signal that is protecting the sections of design netlist 206 where the resiliency template is identified in protected resiliency templates data structure 218.

Once validation mechanism 202 has identified those sections of design netlist 206 where the resiliency templates are identified in resiliency input/output data structure 212 that are protected by one or more error signals in the set of error signals 216, validation mechanism 202 outputs those sections of design netlist 206 where instances of resiliency templates are identified as protected by one or more error signals in the set of error signals 216 in protected resiliency templates data structure 218 to the system design team of the larger chip.

As will be appreciated by one skilled in the art, aspects of the present invention may be embodied as a system, method, or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in any one or more computer readable medium(s) having computer usable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CDROM), an optical storage device, a magnetic storage device, or any suitable combination of the foregoing. In the context of this document, a computer readable storage medium may be any tangible medium that can contain or store a program for use by or in connection with an instruction execution system, apparatus, or device.

A computer readable signal medium may include a propagated data signal with computer readable program code embodied therein, for example, in a baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Computer code embodied on a computer readable medium may be transmitted using any appropriate medium, including but not limited to wireless, wireline, optical fiber cable, radio frequency (RF), etc., or any suitable combination thereof.

Computer program code for carrying out operations for aspects of the present invention may be written in any combination of one or more programming languages, including an object oriented programming language such as Java™, Smalltalk™, C++, or the like, and conventional procedural programming languages, such as the "C" programming language or similar programming languages. The program code may execute entirely on the user's computer, partly on the user's computer, as a stand-alone software package, partly on the user's computer and partly on a remote computer, or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to the illustrative embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions that implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus, or other devices to produce a computer implemented process such that the instructions which execute on the computer or other programmable apparatus provide processes for implementing the functions/acts specified in the flowchart and/or block diagram block or blocks.

Figure 3:
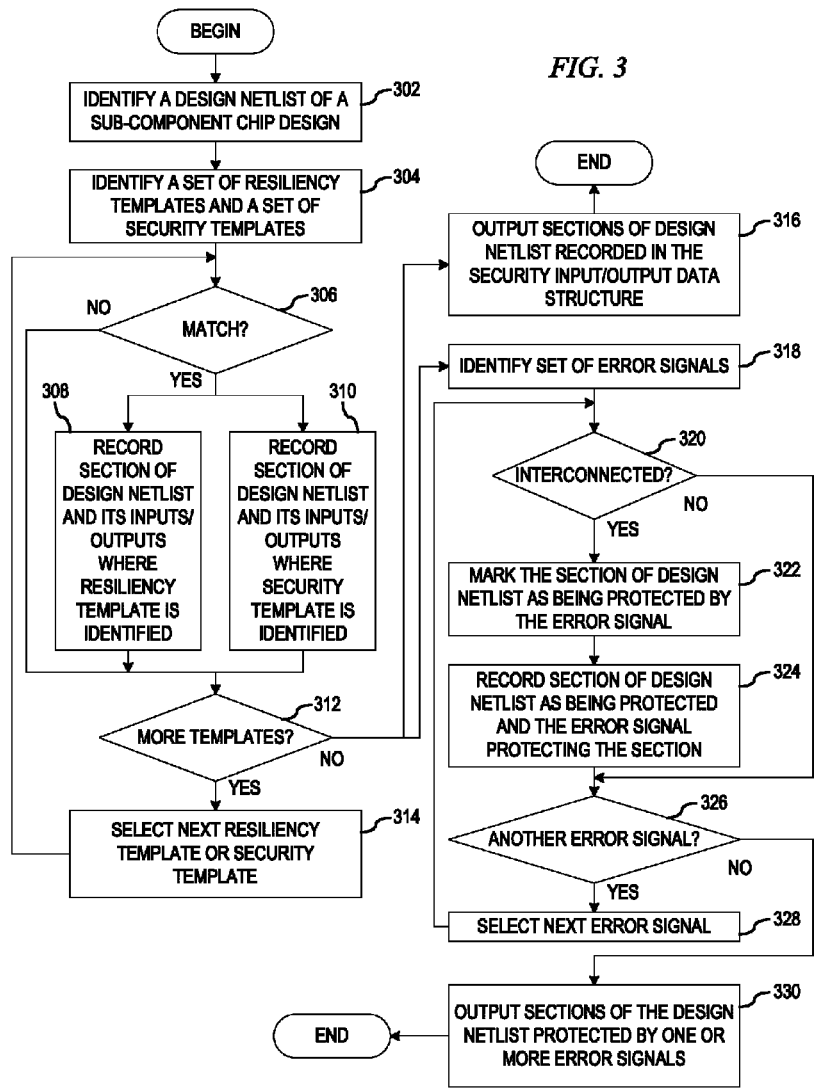
FIG. 3 depicts a flowchart of the operation performed by a validation mechanism in validating overall resilience and security characteristics of sub-component chip designs in accordance with an illustrative embodiment.

FIG. 3 depicts a flowchart of the operation performed by a validation mechanism in validating overall resilience and security characteristics of sub-component chip designs in accordance with an illustrative embodiment. As the operation begins, the validation mechanism receives a design netlist 206 of a sub-component chip design from an outside source (step 302). The validation mechanism then identifies a set of resiliency templates and a set of security templates (step 304) in order to evaluate and verify that proprietary design implementation of the sub-component chip design indeed meets the requirements of the system design team of the larger chip design. Each template in the set of resiliency templates and the set of security templates is a library of known structures which may be interconnections of patterns (such as a network of parity trees, a network of syndrome calculators), a known firmware block or hardware/firmware blocks (hardware that triggers certain known firmware patterns), or certain configuration bits of test structures and matching patterns, configuration bits in processor with patterns of hardware, or the like.

For each template in the set of resiliency templates and the set of security templates, the validation mechanism determines whether that exact template appears in the design netlist (step 306). That is, the validation mechanism determines whether the exact configuration, interconnection, or the like, of electronic components in the selected template appears in one or more locations within the design netlist. If at step 306 the validation mechanism identifies a section of the design netlist that matches one of either a resiliency template or a security template, the validation mechanism records the inputs that feed the section of the design netlist matching the resiliency template as well as the outputs coming out of the section of the design netlist matching the resiliency template in a resiliency input/output data structure along with a record of the resiliency template that was matched (step 308) or records the inputs that feed the section of the design netlist matching the security template as well as the outputs coming out of the section of the design netlist matching the security template in a security input/output data structure along with a record of the security template that was matched (step 310).

From either step 308 or 310, the validation mechanism determines whether there is another resiliency template in the set of resiliency templates or another security template in the set of security templates to be searched for in the design netlist (step 312). If at step 312 there is another resiliency template in the set of resiliency templates or another security template in the set of security templates to be searched for in the design netlist, the validation selects a next resiliency template or security template (step 314), with the operation returning to step 306. If at step 306 the validation mechanism fails to identify a portion of the design netlist that matches one of either a resiliency template or a security template, the operation proceeds to step 312.

If at step 312 there is not another resiliency template in the set of resiliency templates and not another security template in the set of security templates to be searched for in the design netlist, the validation mechanism outputs those sections of the design netlist where instances of security templates are identified with their associated inputs/outputs recorded in the security input/output data structure to the system design team of the larger chip (step 316), with this portion of the operation ending thereafter. Further, from step 312, for those sections of the design netlist where instances of resiliency templates are identified with their associated inputs/outputs recorded in the resiliency input/output data structure, the validation mechanism identifies a set of error signals provided by the outside source of the design netlist to identify which instances of the resiliency templates in the resiliency input/output data structure are protected by one or more error signals in the set of error signals (step 318).

For each error signal in the set of error signals, the validation mechanism performs a breadth-first search (BFS) of each latch within the design netlist to detect whether the signal emanates from one or more of the sections of the design netlist where instances of the resiliency templates are identified in the resiliency input/output data structure utilizing the one or more associated outputs of the error signal (step 320). If at step 320 the validation mechanism determines that one or more outputs associated with the one or more sections of the design netlist where instances of the resiliency templates are identified in the resiliency input/output data structure are interconnected to at least one output associated with the error signal, the validation mechanism marks the section of the design netlist where an instance of the resiliency template is identified as being protected by the error signal (step 322). The validation mechanism then records the section of the design netlist where an instance of the resiliency template is identified being protected and the error signal that is protecting the section of the design netlist where the instance of the resiliency template is identified in a protected resiliency template data structure (step 324).

From step 324 or if at step 320 the validation mechanism fails to identify one or more outputs associated with the one or more sections of the design netlist where instances of the resiliency templates are identified in the resiliency input/output data structure are interconnected to at least one output associated with the error signal, then the validation mechanism determines whether there is another error signal to process (step 326). If at step 326 there is another error signal to process, the validation selects a next error signal (step 328), with the operation returning to step 320. If at step 326 there is not another error signal to process, the validation mechanism outputs those sections of the design netlist where instances of resiliency templates are identified as protected by one or more error signals in the set of error signals in the protected resiliency template data structure to the system design team of the larger chip (step 330), with the operation ending thereafter.

The flowchart and block diagrams in the figures illustrate the architecture, functionality, and operation of possible implementations of systems, methods, and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

Thus, the illustrative embodiments provide mechanisms for validation of the overall resilience and security characteristics sub-component chip designs, in particular, those where the detailed functionality is not fully known where only a netlist is available to be integrated into a larger chip design, is problematic. The illustrative embodiments search for and identify the existence on the sub-component chip design of one or more among a collection of resiliency templates and security templates. Further, once one or more resiliency templates are identified, the illustrative embodiments identify how the existence of such resiliency templates relates to characteristics of the chip such as: error recovery, general resilience, cryptography, security, or the like.

As noted above, it should be appreciated that the illustrative embodiments may take the form of an entirely hardware embodiment, an entirely software embodiment or an embodiment containing both hardware and software elements. In one example embodiment, the mechanisms of the illustrative embodiments are implemented in software or program code, which includes but is not limited to firmware, resident software, microcode, etc.

A data processing system suitable for storing and/or executing program code will include at least one processor coupled directly or indirectly to memory elements through a system bus. The memory elements can include local memory employed during actual execution of the program code, bulk storage, and cache memories which provide temporary storage of at least some program code in order to reduce the number of times code must be retrieved from bulk storage during execution.

Input/output I/O devices (including but not limited to keyboards, displays, pointing devices, etc.) can be coupled to the system either directly or through intervening I/O controllers. Network adapters may also be coupled to the system to enable the data processing system to become coupled to other data processing systems or remote printers or storage devices through intervening private or public networks. Modems, cable modems, and Ethernet cards are just a few of the currently available types of network adapters.

The description of the present invention has been presented for purposes of illustration and description, and is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated.

What is claimed is:

1. A method, in a data processing system comprising a processor and a memory coupled to the processor, the memory comprising instructions executed by the processor to cause the processor to validate overall resilience and security characteristics of a sub-component chip design, the method comprising:

for each instance of a resiliency template in a set of resiliency templates identified as appearing in a design netlist of the sub-component chip design thereby forming one or more identified resiliency sections of the design netlist, determining, by the processor, whether an output of the design netlist, where an error signal is output, interconnects to the one or more identified resiliency sections of the design netlist, wherein each resiliency template in the set of resiliency templates is a known circuit design pattern used to check for transient or permanent errors in a chip design;

responsive to the one or more identified resiliency sections of the design netlist interconnecting to the output of the design netlist where the error signal is output, marking, by the processor, the one or more identified resiliency sections of the design netlist as being protected by the error signal; and outputting, by the processor, an identification of the one or more identified resiliency sections of the design netlist and an identification of the error signal protecting the one or more identified resiliency sections of the design netlist to a design team of a larger chip design where the sub-component chip design is to be integrated.

2. The method of claim 1, further comprising:

repeating, by the processor, the determination of whether the output, associated with the error signal, interconnects to the one or more identified resiliency sections of the design netlist for each error signal in a plurality of error signals; and responsive to the one or more identified resiliency sections of the design netlist interconnecting to the output of the design netlist of more than one error signal in the plurality of error signals, outputting, by the processor, each identification of the one or more identified resiliency sections of the design netlist and each identification of the error signal in the set of error signals protecting the one or more identified resiliency sections of the design netlist to the design team of the larger chip design where the sub-component chip design is to be integrated.

3. The method of claim 1, wherein determining whether the output of the design netlist, where the error signal is output, interconnects to the one or more identified resiliency sections of the design netlist is performed in a breadth-first search (BFS) manner.

4. The method of claim 1, wherein the appearance of the resiliency template in the sub-component chip design is determined by the method comprising:

searching, by the processor, the design netlist for an appearance of each resiliency template in the set of resiliency templates; and responsive to identifying an appearance of the resiliency template in the design netlist, recording, by the processor, an identification of the resiliency template and the inputs and outputs of the design netlist associated with the appearance of resiliency template in the design netlist in a resiliency input/output data structure.

5. The method of claim 1, wherein the error signal is at least one of parity, error-correcting code, syndrome calculation, state checking, orthogonality, state bit checking, or residue checking.

6. The method of claim 1, further comprising:

searching, by the processor, the design netlist for an appearance of each security template in a set of security templates;

responsive to identifying an appearance of the security template in the design netlist thereby forming an identified security section of the design netlist, recording, by the processor, an identification of the security template and the inputs and outputs of the design netlist associated with the appearance of security template in the design netlist in a security input/output data structure; and outputting, by the processor, an identification of the identified security section of the design netlist recorded in the security input/output data structure to the design team of the larger chip design where the sub-component chip design is to be integrated.

7. The method of claim 1, wherein the resiliency template is a known structure of interconnections, a known structure of firmware blocks or hardware/firmware blocks, a certain configuration bits of test structures and matching patterns, or a configuration bits in processor with patterns of hardware.

8. A computer program product comprising a non-transitory computer readable storage medium having a computer readable program stored therein, wherein the computer readable program, when executed on a computing device, causes the computing device to:

for each instance of a resiliency template in a set of resiliency templates identified as appearing in a design netlist of the sub-component chip design thereby forming one or more identified resiliency sections of the design netlist, determine whether an output of the design netlist where an error signal is output, interconnects to the one or more identified resiliency sections of the design netlist, wherein each resiliency template in the set of resiliency templates is a known circuit design pattern used to check for transient or permanent errors in a chip design;

responsive to the one or more identified resiliency sections of the design netlist interconnecting to the output of the design netlist where the error signal is output, mark the one or more identified resiliency sections of the design netlist as being protected by the error signal; and output an identification of the one or more identified resiliency sections of the design netlist and an identification of the error signal protecting the one or more identified resiliency sections of the design netlist to a design team of a larger chip design where the sub-component chip design is to be integrated.

9. The computer program product of claim 8, wherein the computer readable program further causes the computing device to:

repeat the computer readable program to determine whether the output, associated with the error signal, interconnects to the one or more identified resiliency sections of the design netlist for each error signal in a plurality of error signals; and responsive to the one or more identified resiliency sections of the design netlist interconnecting to the output of the design netlist of more than one error signal in the plurality of error signals, output each identification of the one or more identified resiliency sections of the design netlist and each identification of the error signal in the set of error signals protecting the one or more identified resiliency sections of the design netlist to the design team of the larger chip design where the sub-component chip design is to be integrated.

10. The computer program product of claim 8, wherein determining whether the output of the design netlist where the error signal is output interconnects to the one or more identified resiliency sections of the design netlist is performed in a breadth-first search (BFS) manner.

11. The computer program product of claim 8, wherein the appearance of the resiliency template in the sub-component chip design is determined by the computer readable program further causing the computing device to:

search the design netlist for an appearance of each resiliency template in the set of resiliency templates; and responsive to identifying an appearance of the resiliency template in the design netlist, record an identification of the resiliency template and the inputs and outputs of the design netlist associated with the appearance of resiliency template in the design netlist in a resiliency input/output data structure.

12. The computer program product of claim 8, wherein the error signal is at least one of parity, error-correcting code, syndrome calculation, state checking, orthogonality, state bit checking, or residue checking.

13. The computer program product of claim 8, wherein the computer readable program further causes the computing device to:
   search the design netlist for an appearance of each security template in a set of security templates;
   responsive to identifying an appearance of the security template in the design netlist thereby forming an identified security section of the design netlist, record an identification of the security template and the inputs and outputs of the design netlist associated with the appearance of security template in the design netlist in a security input/output data structure; and
   output an identification of the identified security section of the design netlist recorded in the security input/output data structure to the design team of the larger chip design where the sub-component chip design is to be integrated.

14. The computer program product of claim 8, wherein the resiliency template is a known structure of interconnections, a known structure of firmware blocks or hardware/firmware blocks, a certain configuration bits of test structures and matching patterns, or a configuration bits in processor with patterns of hardware.

15. An apparatus, comprising:
   a processor; and
   a memory coupled to the processor, wherein the memory comprises instructions which, when executed by the processor, cause the processor to:
   for each instance of a resiliency template in a set of resiliency templates identified as appearing in a design netlist of the sub-component chip design thereby forming one or more identified resiliency sections of the design netlist, determine whether an output of the design netlist, where an error signal is output, interconnects to the one or more identified resiliency sections of the design netlist, wherein each resiliency template in the set of resiliency templates is a known circuit design pattern used to check for transient or permanent errors in a chip design;
   responsive to the one or more identified resiliency sections of the design netlist interconnecting to the output of the design netlist where the error signal is output, mark the one or more identified resiliency sections of the design netlist as being protected by the error signal; and
   output an identification of the one or more identified resiliency sections of the design netlist and an identification of the error signal protecting the one or more identified resiliency sections of the design netlist to a design team of a larger chip design where the sub-component chip design is to be integrated.

16. The apparatus of claim 15, wherein the instructions further cause the processor to:
   repeat the computer readable program to determine whether the output, associated with the error signal, interconnects to the one or more identified resiliency sections of the design netlist for each error signal in a plurality of error signals; and
   responsive to the one or more identified resiliency sections of the design netlist interconnecting to the output of the design netlist of more than one error signal in the plurality of error signals, output each identification of the one or more identified resiliency sections of the design netlist and each identification of the error signal in the set of error signals protecting the one or more identified resiliency sections of the design netlist to the design team of the larger chip design where the sub-component chip design is to be integrated.

17. The apparatus of claim 15, wherein determining whether the output of the design netlist where the error signal is output interconnects to the one or more identified resiliency sections of the design netlist is performed in a breadth-first search (BFS) manner.

18. The apparatus of claim 15, wherein the appearance of the resiliency template in the sub-component chip design is determined by the instructions further causing the processor to:
   search the design netlist for an appearance of each resiliency template in the set of resiliency templates; and
   responsive to identifying an appearance of the resiliency template in the design netlist, record an identification of the resiliency template and the inputs and outputs of the design netlist associated with the appearance of resiliency template in the design netlist in a resiliency input/output data structure.

19. The apparatus of claim 15, wherein the error signal is at least one of parity, error-correcting code, syndrome calculation, state checking, orthogonality, state bit checking, or residue checking.

20. The apparatus of claim 15, wherein the instructions further cause the processor to:
   search the design netlist for an appearance of each security template in a set of security templates;
   responsive to identifying an appearance of the security template in the design netlist thereby forming an identified security section of the design netlist, record an identification of the security template and the inputs and outputs of the design netlist associated with the appearance of security template in the design netlist in a security input/output data structure; and
   output an identification of the identified security section of the design netlist recorded in the security input/output data structure to the design team of the larger chip design where the sub-component chip design is to be integrated.

* * * * *